US010797654B2

(12) United States Patent
Huffenus et al.

(10) Patent No.: US 10,797,654 B2
(45) Date of Patent: Oct. 6, 2020

(54) AMPLIFYING DEVICE COMPRISING A COMPENSATION CIRCUIT

(71) Applicant: DEVIALET, Paris (FR)

(72) Inventors: Alexandre Huffenus, Grenoble (FR); Pierre-Emmanuel Calmel, Le Chesnay (FR)

(73) Assignee: DEVIALET, Paris (FR)

( * ) Notice: Subject to any disclaimer, the term of this patent is extended or adjusted under 35 U.S.C. 154(b) by 0 days.

(21) Appl. No.: 16/327,235

(22) PCT Filed: Aug. 21, 2017

(86) PCT No.: PCT/EP2017/071051
§ 371 (c)(1),
(2) Date: Feb. 21, 2019

(87) PCT Pub. No.: WO2018/036974
PCT Pub. Date: Mar. 1, 2018

(65) Prior Publication Data
US 2019/0207561 A1     Jul. 4, 2019

(30) Foreign Application Priority Data

Aug. 22, 2016   (FR) ..................................... 16 57841

(51) Int. Cl.
*H03F 1/08*     (2006.01)
*H03F 3/185*    (2006.01)
(Continued)

(52) U.S. Cl.
CPC .............. *H03F 1/086* (2013.01); *H03F 1/14* (2013.01); *H03F 1/301* (2013.01); *H03F 3/185* (2013.01);
(Continued)

(58) Field of Classification Search
CPC . H03F 1/086; H03F 1/14; H03F 1/301; H03F 3/2173; H03F 3/2171;
(Continued)

(56) References Cited

U.S. PATENT DOCUMENTS 6,281,767 B1 *   8/2001  Lastrucci .............. H03F 3/2173
                                                    330/207 A
6,396,933 B1 *   5/2002  Jung ..................... H03F 1/0277
                                                        381/96

(Continued)

FOREIGN PATENT DOCUMENTS

JP          4067475        3/2008
WO     WO-2007/016428     2/2007

OTHER PUBLICATIONS

International Search Report for International Application PCT/EP2017/071051, dated Aug. 29, 2017, European Patent Office, Rijswijk, NL.

*Primary Examiner* — Davetta W Goins
*Assistant Examiner* — Kuassi A Ganmavo
(74) *Attorney, Agent, or Firm* — B. Aaron Schulman, Esq.; Stites & Harbison, PLLC

(57) ABSTRACT

The present invention relates to an amplification device (10) of an input signal comprising:
  a first amplification stage (12),
  a second amplification stage (14),
  each amplification stage (12, 14) comprising:
    a switching circuit (22), the switching circuit (22) being able to generate, as output (22A, 22B), a switched signal having at least two states, and
    an inductive element (24) able to smooth the switched signal to obtain a smoothed signal (I1, I3), the smoothed signal (I1, I3) having a useful component and a stray component.

(Continued)

Figure 1:
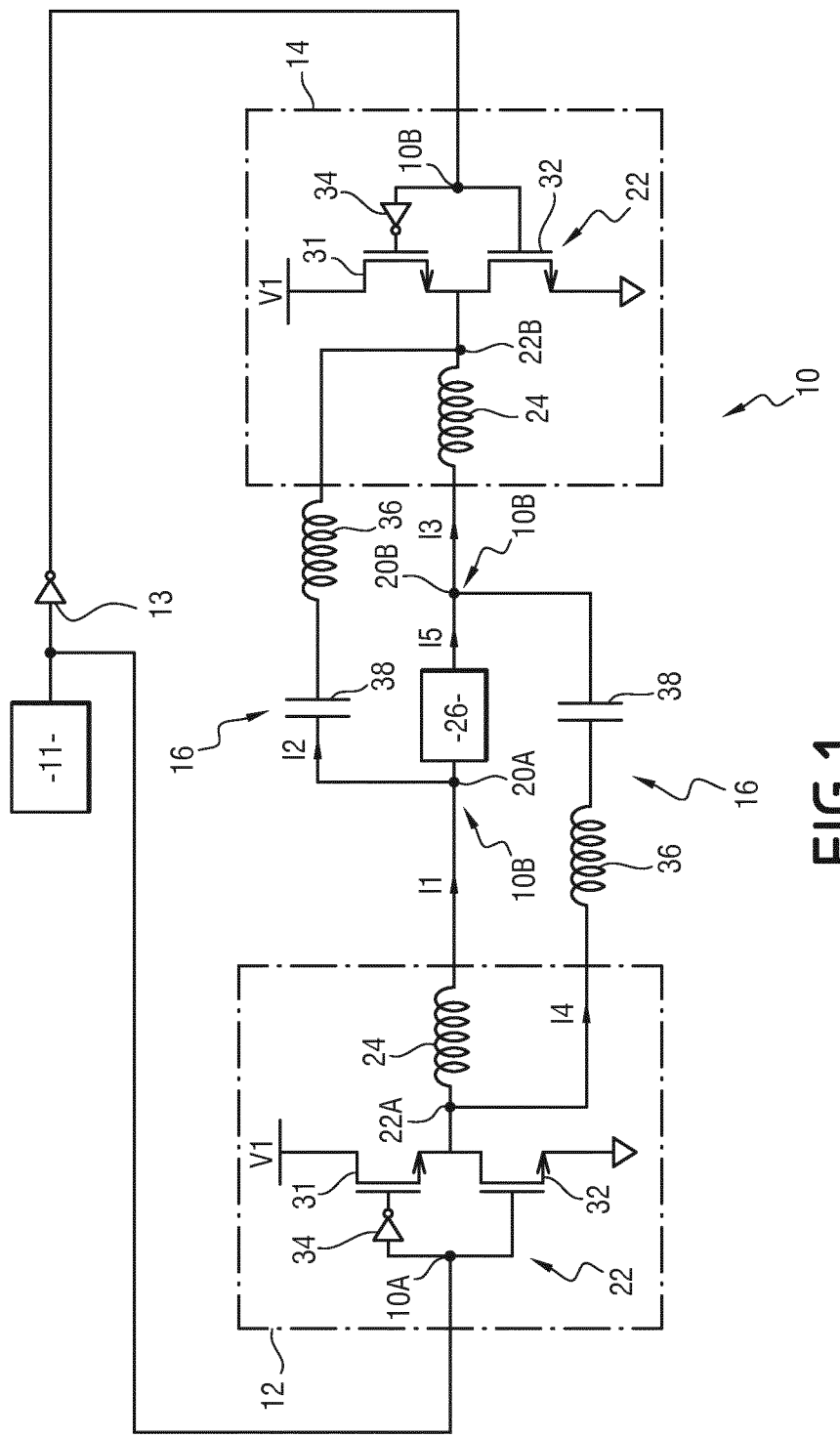

The amplification device (10) further comprises a compensation circuit (16), for each amplification stage (12, 14), able to generate a compensation signal (I2, I4) of the stray component of the smoothed signal (I1, I3) generated in the inductive element (24) of the corresponding amplification stage (12, 14).

8 Claims, 3 Drawing Sheets

(51) Int. Cl.

| | | |
|---|---|---|
| *H03F 3/30* | (2006.01) | |
| *H03F 1/14* | (2006.01) | |
| *H03F 1/30* | (2006.01) | |
| *H03F 3/21* | (2006.01) | |
| *H03F 3/45* | (2006.01) | |
| *H04R 3/00* | (2006.01) | |

(52) U.S. Cl.
CPC ........... *H03F 3/211* (2013.01); *H03F 3/3033* (2013.01); *H03F 3/3061* (2013.01); *H03F 3/3081* (2013.01); *H03F 3/45179* (2013.01); *H04R 3/00* (2013.01); *H03F 2200/03* (2013.01); *H03F 2200/171* (2013.01); *H03F 2200/267* (2013.01); *H03F 2200/297* (2013.01); *H03F 2200/301* (2013.01); *H03F 2200/309* (2013.01); *H03F 2200/33* (2013.01); *H03F 2200/391* (2013.01); *H03F 2200/393* (2013.01); *H03F 2200/417* (2013.01); *H03F 2200/459* (2013.01); *H03F 2200/462* (2013.01); *H03F 2203/45631* (2013.01); *H03F 2203/45638* (2013.01)

(58) Field of Classification Search
CPC ........... H03F 2200/03; H03F 2200/171; H03F 2200/267; H03F 2200/301; H03F 2203/45638; H03F 2200/297; H03F 2200/309; H03F 3/45179; H04R 3/00
See application file for complete search history.

(56) References Cited

U.S. PATENT DOCUMENTS

| | | | | |
|---|---|---|---|---|
| 7,315,204 | B2* | 1/2008 | Seven | H03F 1/0277 330/51 |
| 8,126,164 | B2* | 2/2012 | Bjorn-Josefsen | H03G 3/001 381/109 |
| 2004/0075490 | A1 | 4/2004 | Jeong | |
| 2009/0167574 | A1* | 7/2009 | Liu | H03F 3/45183 341/110 |
| 2012/0299661 | A1* | 11/2012 | Williams | H03F 3/602 330/296 |
| 2016/0056813 | A1* | 2/2016 | Vice | H03G 1/0094 330/297 |
| 2016/0072434 | A1* | 3/2016 | Wachi | H03B 5/24 331/117 FE |

* cited by examiner

AMPLIFYING DEVICE COMPRISING A
COMPENSATION CIRCUIT

The present invention relates to an amplification device of an input signal comprising:
- a differential input for the input signal,
- a differential output for an output signal,
- a first amplification stage having an input,
- a second amplification stage having an input,
- the inputs of each amplification stage forming the differential input,
- each amplification stage comprising:
  - an output for a load, the outputs of each amplification stage forming the differential output,
  - a switching circuit, the switching circuit being able to generate, as output, a switched signal having at least two states,
  - an inductive element connected between the output of the switching circuit and the output of the amplification stage, the inductive element being able to smooth the switched signal generated by the switching circuit to obtain a smoothed signal, the smoothed signal having a useful component and a stray component,
- the switched signals at the output of the switching circuits of each amplification stage being opposite.

Such an amplification device is for example used as amplifier of the voltage across the terminals of a load.

When the load is an audio component, such as a speaker, the triangular high-frequency stray component, generated in the inductive element of the amplification stage, harms the quality of the audio signal retrieved by the speaker.

Furthermore, such a stray component is at the origin of heating of the amplification device and the load, which causes a loss of performance at the output of the amplification device.

There is therefore a need to reduce the stray component generated by the inductive element of such an amplification device.

To that end, the invention relates to an amplification device as previously described, in which the amplification device further comprises a compensation circuit, for each amplification stage, capable of generating a compensation signal of the stray component of the smoothed signal generated in the inductive element of said amplification stage, each compensation circuit being connected to the output of the corresponding amplification stage and the output of the switching circuit of the other amplification stage, the differences of each smoothed signal and the corresponding compensation signal forming the output signal at the output of the amplification device.

According to specific embodiments, the amplification device comprises one or more of the following features, considered alone or according to any technically possible combinations:
- each compensation circuit comprises at least one inductive element, the relative deviation between the inductance of the inductive element of the compensation circuit and the inductance of the inductive element of the corresponding amplification stage being less than or equal to 30 percent;
- each compensation circuit comprises a high-pass filter;
- the high-pass filter comprises a capacitor;
- the input signal is a signal modulated by a carrier frequency, the high-pass filter having a cutoff frequency strictly lower than a carrier frequency of the input signal;
- the input signal is a useful frequency, the high-pass filter having a cutoff frequency strictly higher than the useful frequency of the input signal;
- the amplification stages are amplification stages of a digital signal, the device further comprising at least one analog amplifier connected at the output of one of the amplification stages;
- the or each analog amplifier is a class A or AB amplifier;
- the device further comprises a device for measuring the output current of each analog amplifier and a control module capable of receiving at least the measurement of the output current of each analog amplifier, the control module being able to generate the signals at the input of the amplification stages as a function of the measured output currents such that, on the one hand, the switched signals at the output of the switching circuits of said stages are opposite, and on the other hand, the output current of each of the analog amplifiers is minimized;
- the input signals of each amplification stage are in phase opposition during more than 70 percent of the time.

The invention also relates to an audio system comprising:
- an amplification device as previously described, and
- a speaker connected to the output of each amplification stage.

Figure 2:
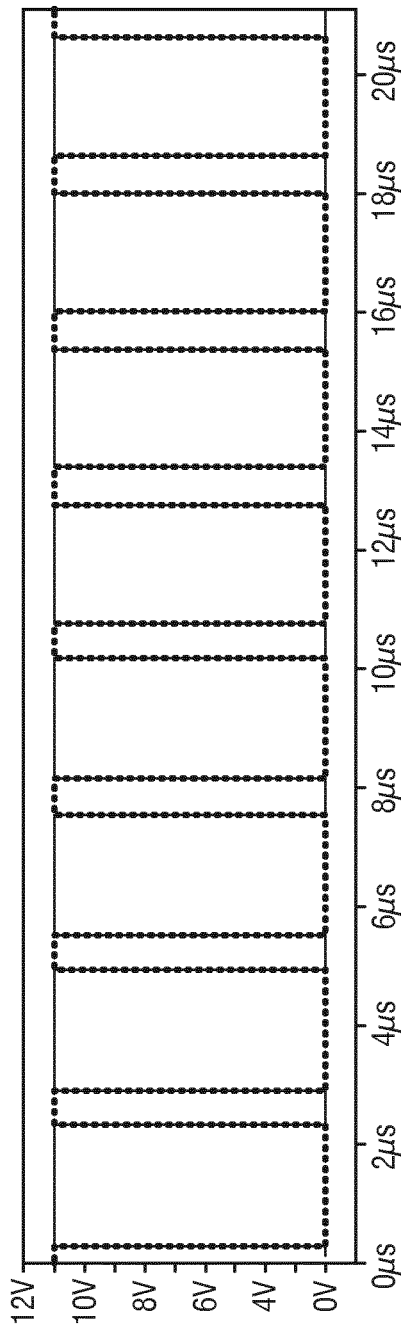
Figure 3:
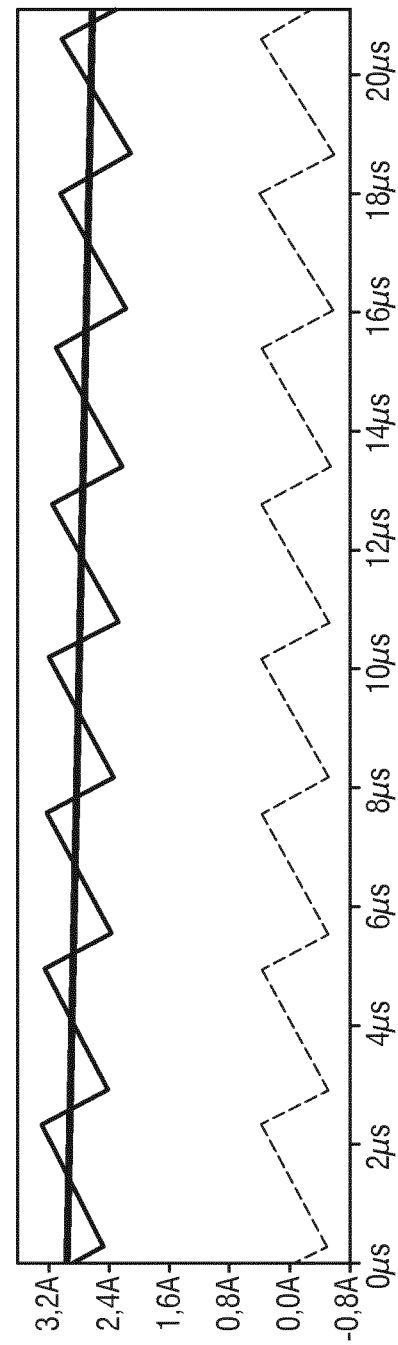
Figure 4:
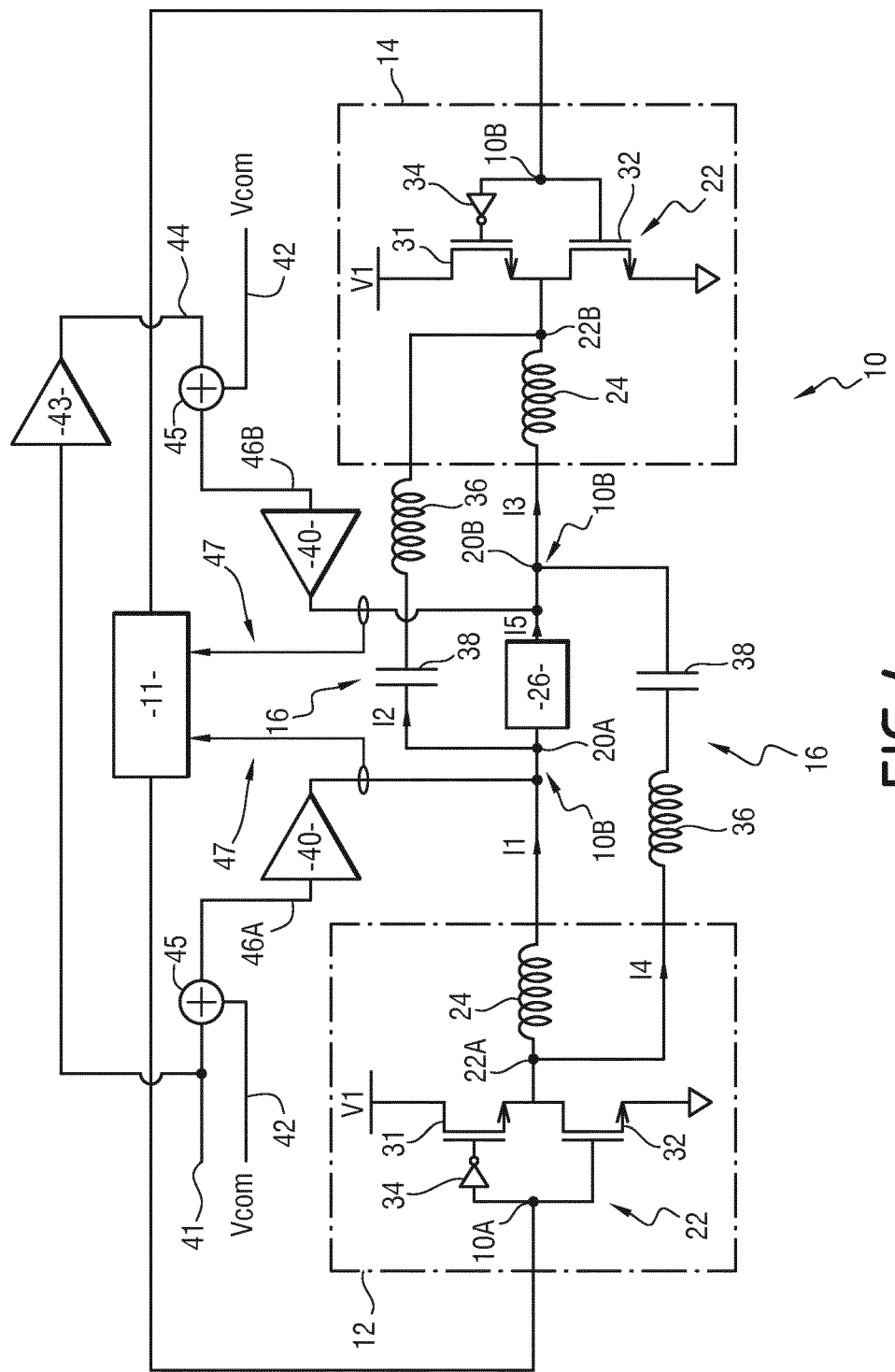

Other features and advantages of the invention will appear upon reading the following description of embodiments of the invention, provided solely as an example and done in reference to the drawings, which are:

FIG. 1, a schematic view of one example of an amplification device according to a first embodiment of the invention, FIG. 2, an example of a first chronograph showing the output voltages of the switching circuits of each amplification stage of the amplification device, FIG. 3, an example of a second chronograph showing the stray component of a smoothed signal, the compensation signal of said stray component and the resultant of the two signals, and FIG. 4, a schematic view of one example of an amplification device according to a second embodiment of the invention.

An amplification device 10 according to a first embodiment of the invention is illustrated in FIG. 1.

The amplification device 10 is also known under the name "amplification bridge".

The amplification device 10 comprises two inputs 10A, 10B receiving signals in phase opposition forming a differential input signal to be amplified and two outputs 20A, 20B for an amplified differential output signal. The two inputs 10A, 10B of the amplification device 10 form a differential input. The two outputs 20A, 20B of the amplification device 10 form a differential output.

The input signal is for example generated by a control module 11 and an inverter 13, as shown in FIG. 1. The input signal is for example a pulse width modulated signal, characterized by a carrier frequency and a useful frequency band. The useful frequency band is for example the interval comprised between 20 Hertz (Hz) and 100 kilohertz (kHz). The carrier frequency is for example greater than or equal to 400 kHz.

The input signal is a voltage. As shown in FIG. 1, the signal received by one of the two inputs 10A, 10B of the amplification device is inverted by the inverter 13 such that the signals received by each of the two inputs 10A, 10B are in phase opposition and form a differential input signal.

The amplification device 10 further comprises a first amplification stage 12, a second amplification stage 14 and a compensation circuit 16 for each amplification stage 12, 14.

Each amplification stage 12, 14 comprises an input corresponding to the inputs 10A, 10B of the amplification device 10, an output 20A, 20B corresponding to the outputs 20A, 20B of the amplification device 10, a switching circuit 22 and an inductive element 24. The outputs 20A, 20B of each amplification stage 12, 14 are intended to be connected to a same load 26, such as a speaker, to form an audio system.

The two amplification stages 12, 14 are powered by a same supply voltage V1. The supply voltage V1 is for example positive.

Each switching circuit 22 comprises at least two transistors 31, 32 connected in series between the supply voltage V1 and a ground. The input of each switching circuit 22 corresponds to the input 10A, 10B of the corresponding amplification stage 12, 14. The output of each switching circuit 22 of the stages 12, 14 is formed by a midpoint 22A, 22B between the two transistors 31, 32 of each of the stages 12, 14.

The gate of the transistors 31, 32 of each amplification stage 12, 14 is connected to the input of the switching circuit 22 so as to be supplied by the input signal. The gate of one of the transistors 31, 32 of each amplification stage 12, 14 being connected to an inverter 34, when one of the transistors 31, 32 is on, the other transistor 31, 32 is off.

The transistors are for example MOSFET transistors.

The switching circuit 22 of each amplification stage 12, 14 is able to generate a switched signal having at least two states from the input signal 10A, 10B of said amplification stage 12, 14 and the supply voltage V1. The supply voltages V1 of the two stages 12, 14 being identical and the input signals 10A, 10B of said stages 12, 14 being in phase opposition, the switched output signals 22A, 22B of the switching circuits 22 of each stage 12, 14 have opposite states. Thus, when the switched output signal 22A of the switching circuit 22 of the first amplification stage 12 has a voltage equal to the supply voltage V1, respectively equal to the nil voltage, the switched output signal 22B of the switching circuit 22 of the second amplification stage 12 has a voltage equal to the nil voltage, respectively equal to the supply voltage V1.

The inductive element 24 is for example formed by a coil. The inductive element 24 of each amplification stage 12, 14 is connected to the output 22A, 22B of the switching circuit 22 of said stage 12, 14, on the one hand, and the output 20A, 20B of said stage 12, 14, on the other hand.

The inductive element 24 is able to smooth the switched signal generated by the corresponding switching circuit 22 in order to obtain a smoothed signal I1, I3. The smoothed signal I1, I3 has a useful component and a stray component. The useful component is low frequency and the stray component is high frequency.

The useful component of the smoothed signal I1, I3 is the component carrying the useful part of the input signal to be amplified. In the case of an audio amplifier, the useful component is the music to be amplified, for example the frequency signals between 20 Hz and 100 kHz.

The stray component of the smoothed signal I1, I3 is a component relative to a triangular ripple current, generated in the inductive element 24. Such a ripple current is due to a high-frequency variation of the voltage across the terminals of the inductive element 24. Such a ripple current for example has a carrier frequency equal to 400 kHz.

Each compensation circuit 16 is connected on the one hand to the output 20A, 20B of the corresponding amplification stage 12, 14, and on the other hand to the output 22A, 22B of the switching circuit 22 of the other amplification stage 12, 14. In other words, the compensation circuit 16 of an amplification stage 12, 14 is connected in parallel to the inductive element 24 and the output 20A, 20B of the other amplification stage 12, 14.

Each compensation circuit 16 is able to generate a compensation signal I2, I4 of the stray component of the smoothed signal I1, I3 generated in the inductive element 24 of the corresponding amplification stage 12, 14.

Each compensation circuit 16 comprises at least an inductive element 36 and a high-pass filter 38.

Ideally, the inductances of each inductive element 24 and the inductive element 36 of the corresponding compensation circuit have the same value. In practice, the relative deviation between the inductance of the inductive element 36 of the compensation circuit 16 and the inductance of the inductive element 24 of the corresponding amplification stage 12, 14 being less than or equal to 30 percent (%). In the present case, the relative deviation is the ratio of the absolute value of the difference between the inductance of the inductive element 36 of the compensation circuit 16 and the inductance of the inductive element 24 of the corresponding amplification stage 12, 14, by the inductance of the inductive element 24 of said amplification stage 12, 14.

The high-pass filter 38 is formed by a capacitor in its interaction with the inductive element 36 of the corresponding compensation circuit 16.

The high-pass filter 38 is able to authorize the passage of the high-frequency stray component of the smoothed signal I1, I3 in the compensation circuit 16 of said high-pass filter 38.

The high-pass filter 38 of each compensation circuit 16 has a cutoff frequency strictly lower than the carrier frequency.

The high-pass filter 38 has a cutoff frequency strictly higher than the useful frequency of the smoothed signal I1, I3.

The cutoff frequency is for example between 100 kHz and 300 kHz.

Thus, such an amplification device 10 makes it possible, via the compensation signals I2, I4 generated by the compensation circuits 16, to compensate the high-frequency stray component of the smoothed signal I1, I3 generated in the inductive element 24 of each amplification stage 12, 14. The compensation signals I2, I4 make it possible to prevent the high-frequency stray components of the smoothed signals I1, I3 from passing through the load 26.

The difference of the smoothed signal I1, I3 and the compensation signal I2, I4 of each application stage 12, 14 forms the amplified output signal I5 at the output 20A and 20B of the amplification device 10. The amplified signal is a current.

The chronographs of FIGS. 2 and 3 illustrate the shape of the signals.

In particular, FIG. 2 illustrates, in dotted lines, the output voltage 22A of the switching circuit 22 of the first amplification stage 12 and in solid lines, the output voltage 22B of the switching circuit 22 of the second amplification stage 14. As shown in FIG. 2, such voltages have opposite states and switch at 400 kHz between two respective voltage states equal to 20 Volts (V) and 0 V.

FIG. 3 illustrates, in thin solid lines, the high-frequency triangular stray component of the smoothed signal I1 of the first amplification stage 12; in dotted lines, the compensation signal I2 of said stray component; and in thick solid lines, the output signal I5 obtained by the difference between the smoothed signal I1 and the compensation signal I2. In the example of FIG. 3, the smoothed signal I1 is a current of amplitude equal to within plus or minus 0.4 Amperes to a frequency of 400 kHz. In the example of FIG. 3, the output signal I5 is rid of the high-frequency triangular stray component of the smoothed signal I1 and then only comprises the low-frequency part of the signal, i.e., the useful component.

The configuration of the first amplification stage 12 and the second amplification stage 14 allows the simple production of the compensation circuits 16. Indeed, each compensation circuit 16 is supplied directly by the switching circuit 22 of the other amplification stage 12, 14. No other additional supply is therefore required or any other active component, such as any transistor, for example.

An amplification device 10 according to a second embodiment is illustrated in FIG. 4.

The amplification device 10 according to the second embodiment comprises the same elements as the first embodiment. These elements are therefore not described again.

The amplification device 10 further comprises at least one analog amplifier 40. In FIG. 4, two analog amplifiers 40 are shown.

Each analog amplifier 40 is connected to the output 20A, 20B of one of the amplification stages 12, 14. In the case at hand, one of the amplifiers 40 illustrated in FIG. 4 is connected to the output 20A of the first amplification stage 12 and the other amplifier 40 is connected to the output 20B of the second amplification stage 14.

Each amplifier 40 is for example a class A or class AB amplifier. A class A amplifier is an amplifier having a very high linearity and a low output impedance. Preferably, the output impedance of a class A amplifier is less than 0.2 Ohms. A class B amplifier is an amplifier including amplification elements that operate in linear state for only half the time and are off substantially the other half of the time. A class AB amplifier is an amplifier able to switch from an on state to an off state such that the amplifier is class A for low powers, and class B for higher powers.

In the example illustrated in FIG. 4, the signal to be amplified 41 is inverted by an amplifier 43 with gain −1 to yield an intermediate signal 44. The signal to be amplified 41 and the intermediate signal 44 therefore constitute a differential signal.

A reference voltage Vcom is added to each of the signal to be amplified 41 and the intermediate signal 44 by means of adders 45 so as to form the respective input signals 46A and 46B of each of the amplifiers 40. The reference voltage Vcom is between the supply voltage V1 and the ground. Advantageously, the reference voltage Vcom is equal to half the supply voltage V1. The input signals 46A and 46B of the amplifiers 40 are voltages.

Thus, the input signals 46A and 46B of the amplifiers 40 have a same direct component Vcom and opposite alternating components.

As illustrated in FIG. 4, a measuring device 47 is able to measure the output current of each of the amplifiers 40 and to provide the measurements done to the control module 11. For example, the measuring device 47 comprises a Hall effect sensor able to measure the output currents via the difference of the supply currents of each of the amplifiers 40.

The control module 11 is able to control each of the amplification stages 12, 14 such that the input signals 10A, 10B of the amplification stages 12, 14 are opposed (therefore the switched output signals 22A, 22B of the switching circuits 22 of said stages 12, 14 are opposed), while minimizing the current supplied by each of the amplifiers 40. The input signals 46A and 46B of the amplifiers 40 being in phase opposition and centered around the reference voltage Vcom, the input signals 10A and 10B of the amplification stages 12, 14 also have opposite states if the reference voltage Vcom is equal to half the supply voltage V1 and if all of the components 22, 31, 32, 24, 36, 38 of each of the stages 12, 14 have the same value for each of the stages 12, 14. In practice, the low dispersions of the values of these components, less than 30%, guarantee that the input signals 10A, 10B of the amplification stages 12, 14 are in phase opposition for more than 70% of the time.

The amplification device 10 according to the second embodiment makes it possible to perform both an analog amplification and a digital amplification of an analog signal to be amplified 41. The amplification device 10 has a linearity at least equal to that of the analog amplifiers 40 used in the system and an energy efficiency very close to that of the digital amplification stages 12, 14 used, inasmuch as the analog amplifiers 40 consume very little current, therefore very little power. For example, the amplifiers 40 supply less than 1% of the current I5 provided to the load 26. Thus, such an amplification device 10 is suitable for amplifying audio signals, for example, intended for a speaker, with a very high linearity and a very high energy efficiency.

Furthermore, the compensation circuits 16 make it possible to prevent the high-frequency triangular stray components of the smoothed signals from being absorbed in the analog amplifiers 40, which would result in causing them to heat up and deteriorate the quality of the output signal and the performance of such amplifiers 40.

The invention claimed is:

1. An amplification device of an input signal comprising:
a differential input for the input signal,
a differential output for an output signal,
a first amplification stage having an input,
a second amplification stage having an input,
the inputs of each amplification stage forming the differential input,
each amplification stage comprising:
  an output for a load, the outputs of each amplification stage forming the differential output,
  a switching circuit, the switching circuit being able to generate, as output, a switched signal having at least two states,
  an inductive element connected between the output of the switching circuit and the output of the amplification stage, the inductive element being able to smooth the switched signal generated by the switching circuit to obtain a smoothed signal, the smoothed signal having a useful component and a stray component, the switched signals at the output of the switching circuits of each amplification stage being opposite,
the amplification device further comprising a compensation circuit, for each amplification stage, the amplification device being capable of generating a compensation signal of the stray component of the smoothed signal generated in the inductive element of said amplification stage, each compensation circuit being connected to the output of the corresponding amplification stage and the output of the switching circuit of the other amplification stage, the differences of each smoothed signal and the corresponding compensation signal forming the output signal at the output of the amplification device; wherein (a) the amplification stages are amplification stages of a digital signal, the device further comprising at least one analog amplifier, the output of which is connected at the output of one of the amplification stages;

(b) the or each analog amplifier is either a class A amplifier and a class AB amplifier; and (c) the device further comprises a device for measuring the output current of each analog amplifier and a control module capable of receiving at least the measurement of the output current of each analog amplifier, the control module being able to generate the signals at the input of the amplification stages as a function of the measured output currents so that, on the one hand, the switched signals at the output of the switching circuits of said stages are opposite, and on the other hand, the output current of each of the analog amplifiers is minimized.

2. The amplification device according to claim 1, wherein each compensation circuit comprises at least one inductive element, the relative deviation between the inductance of the inductive element of the compensation circuit and the inductance of the inductive element of the corresponding amplification stage being less than or equal to 30 percent.

3. The amplification device according to claim 1, wherein each compensation circuit comprises a high-pass filter.

4. The amplification device according to claim 3, wherein the high-pass filter comprises a capacitor.

5. The amplification device according to claim 3, wherein the input signal is a signal modulated by a carrier frequency, the high-pass filter having a cutoff frequency strictly lower than a carrier frequency of the input signal.

6. The amplification device according to claim 3, wherein the input signal is a useful frequency, the high-pass filter having a cutoff frequency strictly higher than the useful frequency of the input signal.

7. The amplification device according to claim 1, wherein the input signals of each amplification stage are in phase opposition during more than 70 percent of the time.

8. An audio system comprising:
an amplification device according to claim 1, and
a speaker connected to the output of each amplification stage.

\* \* \* \* \*